United States Patent
Shao et al.

(12)

(10) Patent No.: US 6,316,160 B1
(45) Date of Patent: Nov. 13, 2001

(54) FAST-ETCHING, THERMOSETTING ANTI-REFLECTIVE COATINGS DERIVED FROM CELLULOSIC BINDERS

(75) Inventors: Xie Shao, Rolla; Jim D. Meador, Ballwin; Terry Lowell Brewer, Rolla, all of MO (US)

(73) Assignee: Brewer Science, Inc., Rolla, MO (US)

( * ) Notice: Subject to any disclaimer, the term of this patent is extended or adjusted under 35 U.S.C. 154(b) by 0 days.

(21) Appl. No.: 09/643,695

(22) Filed: Aug. 22, 2000

Related U.S. Application Data

(63) Continuation of application No. 09/069,573, filed on Apr. 29, 1998, now abandoned.

(51) Int. Cl.$^7$ ....................................... G03F 7/11
(52) U.S. Cl. ..................... 430/271.1; 430/531; 527/303; 527/309; 527/312
(58) Field of Search ................. 430/271.1, 531; 527/303, 309, 312

(56) References Cited

U.S. PATENT DOCUMENTS

| | | | |
|---|---|---|---|
| 3,491,037 | 1/1970 | Keys et al. | 260/15 |
| 3,661,619 | 5/1972 | Surland | 117/62.2 |
| 4,007,144 | 2/1977 | Sanders et al. | 260/15 |
| 4,133,783 | 1/1979 | Brewer et al. | 260/15 |
| 4,780,228 | 10/1988 | Gardiner et al. | 252/51 |
| 4,910,122 | 3/1990 | Arnold et al. | 430/313 |
| 5,094,765 | 3/1992 | DeRosa et al. | 252/51.5 |
| 5,234,990 | 8/1993 | Flaim et al. | 524/609 |
| 5,294,680 | 3/1994 | Knors et al. | 525/327.4 |
| 5,382,495 | 1/1995 | Nizolek et al. | 430/162 |
| 5,401,614 | 3/1995 | Dichiara et al. | 430/323 |
| 5,421,618 | 6/1995 | Okazaki et al. | 283/82 |
| 5,482,817 | 1/1996 | Dichiara et al. | 430/271.1 |
| 5,554,485 | 9/1996 | Dichiara et al. | 430/271.1 |
| 5,578,676 | 11/1996 | Flaim et al. | 430/271.1 |
| 5,597,868 | 1/1997 | Kunz | 525/154 |
| 5,607,824 | 3/1997 | Fahey et al. | 430/271.1 |
| 5,641,854 * | 6/1997 | Jones et al. | 528/128 |
| 5,652,297 | 7/1997 | McCulloch et al. | 524/555 |
| 5,654,376 | 8/1997 | Knors et al. | 525/327.4 |
| 5,674,648 | 10/1997 | Brewer et al. | 430/271.1 |
| 5,688,987 | 11/1997 | Meador et al. | 558/393 |
| 5,693,691 | 12/1997 | Flaim et al. | 523/436 |
| 5,851,738 | 12/1998 | Thackeray et al. | 430/327 |

FOREIGN PATENT DOCUMENTS

| | | |
|---|---|---|
| 0542008 | 10/1992 | (EP) . |
| 0639641 | 7/1994 | (EP) . |

OTHER PUBLICATIONS

J. Electrochem. Soc., "Solid–State Science and Technology" Jan. 1982, p. 206.

* cited by examiner

Primary Examiner—Cynthia Hamilton
(74) Attorney, Agent, or Firm—Hovey, Williams, Timmons & Collins

(57) ABSTRACT

Anti-reflective compositions are prepared from cellulosic binders with improved etch rates.

9 Claims, No Drawings

FAST-ETCHING, THERMOSETTING ANTI-REFLECTIVE COATINGS DERIVED FROM CELLULOSIC BINDERS

This application is a continuation of U.S. patent application Ser. No. 09/069,573, filed Apr. 29, 1998, now abandoned.

BACKGROUND OF THE INVENTION

This invention relates to bottom layer anti-reflective coating compositions useful in multilayer photoresist processes. More particularly, it relates to thermosetting anti-reflective compositions having increased plasma etch rate during submicron processing.

Bottom-applied anti-reflective coatings are used extensively in submicron photoresist processes to eliminate the deleterious effects of standing wave formation during photoresist exposure. They are comprised principally of a polymer binder and a light-absorbing compound, or dye, which may be chemically attached to the binder. The coatings are applied onto the substrate and then overcoated with the photoresist. It is important that the anti-reflective coating and the photoresist do not intermix at the interface between the two layers, otherwise photoresist performance and feature quality will be degraded significantly. This requirement to prevent intermixture between the photoresist and the bottom anti-reflective layer has been met in prior art systems by invoking one of two techniques.

In the first method, the polymer binder is selected to have a highly aromatic structure which contains polar linking groups such as amide, imide, amic acid, sulfone, ketone, and urea moieties at regular sites along the polymer main chain. This combination of structural features prevents the anti-reflective coating from dissolving in the liquid photoresist and makes it resistant to intermixing with the coated photoresist layer when the latter is baked during a typical processing cycle. Anti-reflective coating compositions based on this concept are described in the U.S. Patents incorporated herein by reference and numbered as follows: U.S. Pat. No. 4,910,122 to Arnold et al.; U.S. Pat. No. 5,234,990 to Flaim et al.; U.S. Pat. No. 5,294,680 to Knors et al.; U.S. Pat. No. 5,554,485 to Dichiara et al.; U.S. Pat. No. 5,578,676 to Flaim et al.; U.S. Pat. No. 5,607,824 to Fahey et al.; U.S. Pat. No. 5,654,376 to Knors et al.; U.S. Pat. No. 5,674,648 to Brewer et al.; and U.S. Pat. No. 5,693,691 to Flaim et al.

In the second technique, the polymer binder is designed with thermosetting features, :so that after application the coating can be insolubilized by heating. The binder contains inherently crosslinkable functional groups or groups which can be crosslinked by reaction with an added reagent. In most instances, the dye is attached to the binder. Thermosetting anti-reflective coatings are rapidly becoming the preferred compositions for sub-0.35 micron microlithographic applications because of their superior resistance to intermixing with photoresist layers.

Various dye-attached, thermosetting binder chemistries have been developed. They include phenolic binders such as those described in U.S. Pat. No. 5,597,868 to Kunz; acrylic binders such as those described in European Patent Application No. 94305124.3 by Urano et al., European Patent Application No.92118070.9 by Thackeray, U.S. Pat. Nos. 5,652,297 and 5,652,297 to McCulloch et al., and our co-pending U.S. patent application Ser. No. 08/940,169 by Meador et al.; modified epoxy resin binders such as those described in U.S. Pat. No. 5,693,691 to Flaim et al.; aliphatic polyester binders such as those described in our co-pending U.S. patent application Ser. No. 08/954,425 by Shao et al.; polysilane binders such as those described in U.S. Pat. No. 5,401,614 to Dichiara et al.; and vinyl aromatic binders such as those described in U.S. Pat. No. 5,482,817 to Dichiara et al., all of which are incorporated herein by reference.

In sub-0.35 micron processing, the photoresist pattern is transferred into the anti-reflective coating by plasma etching, usually with oxygen as the active etchant. The plasma etching process erodes the photoresist layer at about the same rate as it erodes the anti-reflective coating since both are organic in nature. This leads to two problems: 1) the sidewalls of the photoresist features are etched laterally, causing a negative feature size bias; and 2) the overall thickness of the photoresist is reduced, making it a less effective mask for subsequent plasma etching of the substrate. Such problems render it critical to minimize the degree of thickness required for an effective anti-reflective coating, increase film optical density (i.e., the light-absorbing power per unit coating thickness), and until now it was critical to use low aromatic content in either acrylic or polyester binders. Anti-reflective coatings prepared from these improved binders thermosetting structures exhibit plasma etch rates 1.2–1.8 times that of older-generation anti-reflective coatings prepared from highly aromatic polysulfones.

However, device feature size is rapidly approaching 0.15 microns, meaning any amount of etch biasing will be significant in comparison to the nominal feature size. Furthermore, the photoresists used to print these small feature sizes operate at an exposing wavelength of 193 nm and have poorer plasma etch resistance than the novolac and poly(hydroxystyrene)-based photoresists in widespread use today at higher wavelengths. As a result, severe photoresist thinning can occur during pattern transfer into the anti-reflective coating, even if the latter is very thin in comparison to the photoresist.

Accordingly, there is a need for polymer anti-reflective coatings which exhibit a faster plasma etch rate relative to photoresist layers than prior art compositions, including the low aromatic acrylics and polyesters. Since the polymer binder is usually the major constituent of the anti-reflective layer, its properties largely control the etch rate of the coating. It is known to those skilled in the art (See J. Electrochem. Soc.: Solid State Science & Technology, p. 206, January 1982.) that oxygenated and halogenated polymers etch more rapidly under oxygen plasma conditions than polymers which contain primarily carbon, and especially those polymers which contain carbocyclic aromatic groups such as phenyl and napthyl rings. This property is believed to be responsible for replacing the highly aromatic copolymers, e.g., polysulfones and polyimides, used in older-generation products with less aromatic and more oxygen-rich acrylic and polyester binders.

SUMMARY OF THE RESENT INVENTION

It is a principal object of the present invention to provide a novel anti-reflective coating composition and method of using the same which provides higher plasma etch selectivity to photoresist layers than prior art compositions comprising acrylics and polyesters, while retaining their most desirable features which include:

thermosetting characteristics excellent coating quality and feature coverage at ultra-thin film thicknesses when applied by spin coating methods;

excellent adhesion to semiconductor substrates;

long storage life at room temperature;

fast curing speed;
high optical density at the desired ultraviolet exposing wavelength(s);
no discernable intermixing with photoresist layers.

The improved thermosetting anti-reflective coating composition is substantially comprised of: 1) a cellulose ester or other solvent-soluble cellulose derivative which may or may not contain chemically-attached dye moieties; 2) a multifunctional aminoplast crosslinking agent, 3) an active or latent acid catalyst, 4) a suitable solvent vehicle, and, optionally, 5) a soluble dye or dye mixture which is capable of reacting with the aminoplast crosslinking agent and which enhances the optical density of the coated film at the exposing wavelength(s). The resulting composition is stable at room temperature.

Cellulose esters have, in the past, been formulated into thermosetting coatings for uses such as wood coatings but not for coatings analogous to anti-reflective coatings. The use of cellulose esters in the nonanalogous coatings are described, for example, in the following U.S. Patents incorporated herein by reference: U.S. Pat. No. 4,007,144 to Sanders et al.; U.S. Pat. No. 4,133,783 to Brewer et al.; and U.S. Pat. No. 5,382,495 to Niziolek et al. The suitability of cellulose esters for use as binders in microelectronic coatings, and more specifically, in anti-reflective coatings, is surprising from the above-described prior art because such art requires very different critical requirements from that of the instant microlithographic process, which requires 1) the ability to resist intermixing with adjacent polymer layers, notably, photoresist layers; 2) the ability to form defect-free coatings at ultra-thin film thicknesses of 0.05–0.20 microns; and 3) the ability to form solid solutions with a broad range of organic dyes.

U.S. Pat. No. 5,382,495 to Niziolek, et al., strictly prescribes the use of a hydroxylated resin (preferably a hydroxyl-functional acrylic resin) in conjunction with the cellulose ester. The purpose of the hydroxylated resin according to Niziolek is to provide crosslinking sites for the amino crosslinking agent. They claim (see Column 6, Line 68—Column 7, Line 4) that if the hydroxylated resin is absent, the coating composition will have poor alcohol and chemical resistance. We, of course, do not use a hydroxylated resin as an adjuvant in our anti-reflective coating compositions and would not because it would reduce film optical density. Nevertheless, we surprisingly achieve good alcohol and chemical resistance without the hydroxylated resin and a superior plasma etch rate is achievable by using the cellulose ester alone. The Niziolek compositions are used at 0.15–0.25 mil (or roughly 4–6 microns) versus anti-reflective coatings which are used at 0.05–0.20 microns. The composition of the present invention is applied onto a semiconductor substrate by spin coating and then heated typically for 60 seconds to form a uniform, defect-free, crosslinked coating which exhibits improved etch selectivity to photoresist layers and high optical density at the desired exposing wavelength.

DETAILED DESCRIPTION OF THE INVENTION

The binders of the present invention are cellulose esters and ethers.

The thermosetting anti-reflective coating composition of the present invention preferably comprises:
a) a cellulosic binder selected from the group consisting of solvent-soluble cellulose esters and cellulose ethers;
b) an alkylated aminoplast crosslinking agent derived from melamine, urea, benzoguanamine, or glycoluril;
c) an acid catalyst or a latent acid catalyst which upon heating generates a catalytically active acid species;
d) a solvent vehicle with high solvency for the above-described components and effective surface wetting and evaporation properties to obtain good defect-free coating quality and feature coverage at coating thicknesses of 0.05 to 0.20 microns when the composition is applied onto microelectronic substrates; and, optionally,
e) a solvent-soluble dye or dye mixture comprising effective functional groups for reaction with the aminoplast crosslinking agent during the thermal curing cycle set forth below for the anti-reflective coating.

COMPONENTS OF COMPOSITION a. Cellulosic Binders

A variety of solvent-soluble cellulose ester and cellulose ethers can be used to prepare the title compositions. Of these two groups, cellulose esters are preferred because of their good solubility in common spin coating solvents such as ethyl lactate. Suitable cellulose esters include cellulose acetate, cellulose acetate butyrate, cellulose acetate propionate, cellulose acetate hydrogen phthalate, and cellulose acetate trimellitate. For applications at ultraviolet exposing wavelengths of 193 nm and 248 nm, cellulose acetate hydrogen phthalate and cellulose acetate trimellitate are especially preferred binders since the phthalate and trimellitate ester groups contribute to the optical density of the coating, thus reducing the need for added dyes.

Cellulose ethers such as methyl, ethyl, and hydroxypropyl cellulose can also be used to prepare the new anti-reflective coatings provided they have adequate solubility in preferred coating solvents and contain sufficient residual (non-etherifed) hydroxyl groups to allow insolubilization by reaction with the aminoplast crosslinking agent.

The cellulose derivatives can be further esterified or otherwise chemically modified with aromatic and arylaliphatic reactants to obtain dye-attached binders with increased light absorbency at ultraviolet exposing wavelengths. For example, esterification with 9-anthracenecarboxylic acid, a deep ultraviolet dye used in prior art polymer anti-reflective coatings, will increase optical density at 193 nm and 248 nm wavelengths. Esterification with substituted cinnamic acids, on the other hand, will increase absorbency at mid-ultraviolet wavelengths. Such modified polymer products can be prepared by well known methods such as reaction with acid chlorides and acid anhydrides. The extent of these modifications must be controlled, however, so that all of the residual hydroxyl groups on the cellulose polymer are not consumed. Otherwise, the cellulose binder will not be insolubilized by the crosslinking agent during the bake cycle of the anti-reflective coating.

b. Aminoplast Crosslinking Agent

The new anti-reflective coating composition is cured on the semiconductor substrate by the application of heat. Heating induces a crosslinking reaction between the residual hydroxyl substituents on the cellulose polymer and the aminoplast crosslinking agent. A similar reaction occurs between the crosslinking agent and the added dyes, if present. The resulting structure is highly solvent-resistant and impervious to the interdiffusion of photoresist components. Such curing processes are well known from the prior art. Suitable aminoplast crosslinking agents include glycoluril-formaldehyde resins, melamine-formaldehyde resins, benzoguanamine-formaldehyde resins, and urea-formaldehyde resins. The use of methlyated and/or butylated forms of these resins is highly preferred for obtaining long storage life (3–12 months) in catalyzed form. Highly methylated melamine-formaldehyde resins having degrees of polymerization less than two are generally useful for preparing the title anti-reflective coatings. Monomeric, methylated glycoluril-formaldehyde resins are especially useful for preparing thermosetting polyester anti-reflective coatings which can be used in conjunction with acid-sensitive photoresists. The aminoplast is preferably added to the coating in a proportion which provides 0.20–2.00 equivalents of alkoxymethyl crosslinking function per reactive group on the polymer binder and dye. A proportion which provides 0.50–1.50 reactive equivalents per reactive group is especially preferred.

c. Acid Catalysts

Strong protonic acids such as p-toluenesulfonic acid, dodecylbenzenesulfonic acid, oxalic acid, phthalic acid, phosphoric acid, and mixtures thereof may be employed suitably as catalysts for the thermosetting composition. Of these, the use of p-toluenesulfonic acid is highly preferred.

Latent acid catalysts which form catalytically active acid species upon heating may also be used effectively in the new anti-reflective coating compositions. Examples of such thermal acid generators include benzoin tosylate; 2-nitrobenzyl tosylate; and tris(2,3-dibromopropyl)-1,3,5-triazine-2,4,6-trione.

d. Solvent Vehicle and Additives

Suitable solvents for the new anti-reflective coating composition include alcohols, esters, glymes, ethers, cyclic ketones, and their admixtures which boil in the range 70°–180° C. Especially preferred solvents and co-solvents include 1-methoxy-2-propanol (PGME), cyclohexanone, 2-heptanone, ethyl 3-ethoxy-propionate, propylene glycol methyl ether acetate, ethyl lactate, and methyl 3-methoxypropionate. Solvent systems containing at least 20 weight percent of an alcohol such as PGME and ethyl lactate are preferred for obtaining long storage life.

The coatings may be amended with small amounts (up to 20 wt. % of total solvents) of conventional high boiling γ-butyrolactone, and tetrahydrofurfuryl alcohol to improve the solubility of the coating components, provided the solvents do not cause coating quality or photoresist incompatibility problems. Surfactants such as 3M Company's FLUORAD® FC-171 or FC-430 and adhesion promoters such as glycidoxypropyl triethoxysilane maybe added to optimize coating performance.

e. Dyes

Solvent-soluble dyes may be added to the anti-reflective coating composition to increase the optical density of the coating at one or more exposing wavelengths. If the dyes are not chemically attached to the cellulosic binder, they should have at least one functional group which is capable of reacting with the crosslinking agent during the bake cycle of the anti-reflective coating. In this way, leaching and thermal diffusion of the dye into the photoresisL during the photoresist coating and baking cycles can be avoided. Dyes having the following functional groups are preferred for achieving efficient reaction with aminoplast crosslinking agents: carboxylic acid, primary alcohol, secondary alcohol, phenolic hydroxyl, amide (unsubstituted and monosubstituted), and amine (unsubstituted and monosubstituted). Of these groups, primary alcohol, secondary alcohol, phenolic hydroxyl, and carboxylic acid are preferred for obtaining long storage life of the coating at room temperature and high reactivity with aminoplast crosslinking agents at curing temperatures in excess of 120° C. The dissolved dyes should have volatility characteristics such that they do not sublime from the coating during the curing cycle. They likewise should have solubility properties which allow them to remain molecularly dispersed in the dried coating without forming separate crystalline phases. Examples of suitable reactive dyes are listed below in Table 1 for each exposing wavelength of interest. It is assumed that the same dyes may contain various substituents without losing their effectiveness.

TABLE 1

Example Reactive Dyes for Improved Anti-Reflective Coating Composition

| Wavelength (nm) | Example Dye | Preferred |
|---|---|---|
| 193 | phenethyl alcohol | |
| | phenoxyethanol | X |
| | benzoic acid | |
| | hydroxyethyl salicylate | |
| | 2,2-isopropylidenediphenol | |
| | phenol/resorcinol | |
| | hydroquinone bis (2-hydroxyethyl) ether | X |
| 248 | 9-anthracenecarboxylic acid | X |
| | 4,4-biphenol | |
| | 4-hydroxybiphenyl | |
| | 1- and 2-naphthoic acids | X |
| | 2,2,4,4-tetrahydroxybenzophenone | |
| | 4,4,-dihydroxybenzophenone | |
| | 2,4-dihydroxybenzophenone | |
| | 8-hydroxyquinoline | |
| 365 | (see structures below; also see U.S. Pat. No. 5,688,987 to Meador, et al.) | |

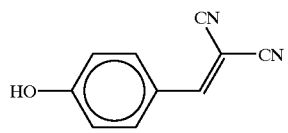

(preferred)

TABLE 1-continued

Example Reactive Dyes
for Improved Anti-Reflective Coating Composition

| Wavelength (nm) | Example Dye | Preferred |
|---|---|---|
| | 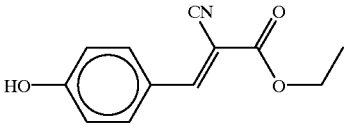 | |
| | 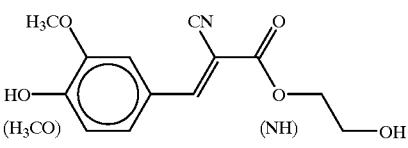 | (preferred) |
| | 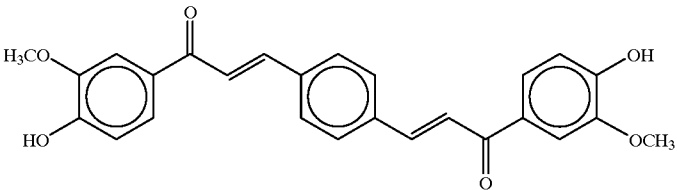 | (preferred) |
| | 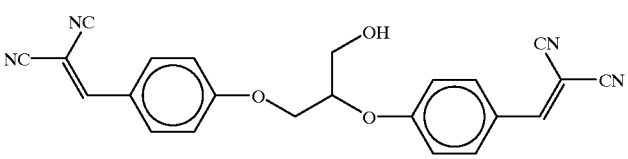 | (preferred) |
| 436 | (curcumin, see below) 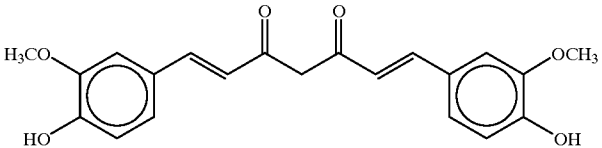 | (preferred) |

Another group of suitable light-absorbing agents comprise dye-attached, hydroxyl-functional resins such as those disclosed in U.S. Pat. No. 5,693,691 to Flaim et al. and co-pending U.S. Patent Application No. 08/954,425 by Shao et al. These low to medium molecular weight resins, which include 1) reaction products of epoxy resins and acidic dyes, and 2) aliphatic polyesters prepared from light-absorbing mono- and dicarboxylic acids, may be added to increase the optical density of the anti-reflective coating and provide greater crosslinking density than can be obtained with simple, low formula weight dyes.

Method of Preparation

The cellulosic binder and other solid components of the improved anti-reflective coating are dissolved in the solvent vehicle and then diluted to the desired total solids concentration. The order of addition generally does not affect the performance of the coating. Heating may be applied in some situations to aid dissolution of the components, but temperatures in excess of 50–60° C. should be avoided to prevent premature reaction of the crosslinking agent. A total solids level of 2.5–10.0 wt. % in the solution is typically required to achieve a film thickness of 350–2500 Å when it is spin coated at 1000–6000 rpm for 30–90 seconds and then cured by baking. Prior to final dilution, the coating may be treated, for example, by ion exchange processes to remove metal ion contamination.

Preferred Coating Compositions

Preferred compositional ranges (expressed in wt. % based on total resin solids) for the cellulosic binder, aminoplast crosslinking agent, acid catalyst, and reactive dye(s) are as follows:

| Component | Useful Range | Especially Preferred Range |
|---|---|---|
| cellulosic binder | 15–90 | 30–80 |
| aminoplast crosslinking agent | 5–40 | 10–35 |
| acid catalyst | 0.1–10 | 2–5 |
| dye or dye-attached resin | 0–60 | 0–35 |

When combined in these proportions, the anti-reflective coating composition exhibits excellent compatibility with photoresists, i.e., no intermixing, as well as good room temperature stability and rapid curing characteristics at bake temperatures in the range 150° C.–225° C.

Method of Use

The improved thermosetting anti-reflective coating composition can be used effectively on all semiconductor substrates including crystalline and polycrystalline silicon, silicon dioxide, silicon (oxy)nitride, aluminum, aluminum/silicon alloys, and tungsten. The anti-reflective coating is applied by spin coating at 1000–6000 rpm for 30–90 seconds. Spinning speeds of 1500–4000 rpm are especially preferred for obtaining uniform, defect-free coatings on 6" and 8" semiconductor substrates. The spin-coated film is then cured at 120–225° C. for 30–120 seconds on a hot plate or equivalent baking unit. Bake temperatures of 150°–200° C. and bake times of 45–90 seconds are especially effective for achieving high resistance to intermixing with photoresist layers. The film thickness is adjusted to 350–2500 Å and, more typically, to 500–1500 Å. The precise final film thickness required for the application will depend upon the reflectivity of the substrate and the properties of the photoresist.

A photoresist is applied by spin coating over the cured anti-reflective coating layer and then soft-baked, exposed, and developed to create the desired lithographic pattern. An optional post-exposure bake may be applied to the photoresist prior to development. The photoresist pattern is then transferred into the anti-reflective layer by reactive ion etching (also known as dry etching or plasma etching) using various gases or gas mixtures which are known in the microlithographic art to be effective for etching organic polymers, e.g., $O_2$, $Cl_2$, $F_2$, $CF_4$, $HCF_3$, $SF_6$, and their admixtures. Diluent gases such as $N_2$, Ar, and He may also be present to improve etch control and etch efficiency. After the anti-reflective coating layer has been etched, the semiconductor substrate can be selectively etched, implanted, or deposited on through the pattern formed in the photoresist and anti-reflective coating layers. When these steps have been completed, the photoresist and anti-reflective coating are removed by plasma etching and/or dissolution in a liquid stripping chemical. The stripped substrate is then ready for a new processing cycle.

EXAMPLES

The following non-limiting examples are illustrative of the invention.

Example 1

Cellulose acetate hydroxy phthalate (2.5 g), methylated glycoluril-formaldehyde resin (0.25 g, POWDERLINK® 1174, Cytec Industries), and p-toluenesulfonic acid monohydrate (0.025 g) were dissolved in 97.25 g of 1-methoxy-2-propanol by stirring to form a thermosetting anti-reflective coating composition. The solution was passed through a 0.2 µm fluorinated filter to remove microparticulates before spin coating.

The solution was spin coated onto silicon and quartz wafers at 2500 rpm for 60 seconds and then baked on a hot plate at 175° C. for 60 seconds to form a cured anti-reflective coating layer. The film thickness of the coating as determined by ellipsometry was 997 Å. Optical absorbance (A) of the film was 0.757 at 193 nm wavelength, indicating an optical density of ~7.6 per micron film thickness.

Spin coating of liquid ethyl lactate, a common photoresist solvent, over the cured anti-reflective coating layer produced no film thickness change in the anti-reflective layer, indicating it was highly crosslinked and solvent-resistant. A comparison test performed on a formulation prepared without the aminoplast crosslinking agent caused the entire coating to be removed. The plasma etch rate of the anti-reflective coating composition was determined relative to an older-generation anti-reflective coating containing an aromatic polysulfone binder (Brewer Science ARC® CD-11). The test was performed using three etchant gas mixtures. The results are tabulated below.

| Gas Mixture | Gas Ratios | Etch Rate (Å/min) | Etch Rate Relative to CD-11 |
|---|---|---|---|
| $CF_4/CHF_3/He/Ar$ | 8/8/12/200 | 1518 | 4.44 |
| $CF_4/He/O_2$ | 26/65/26 | 9168 | 2.34 |
| $Ar/CF_4$ | 200/40 | 4158 | 1.75 |

The significantly faster etch rate of the improved composition relative to the older product, especially for the second gas mixture where oxygen was present, confirmed the expected advantages for using a cellulosic binder.

Example 2

Cellulose acetate hydroxy phthalate (0.83 g), methylated glycoluril-formaldehyde resin (1.30 g, POWDERLINK® 1174, Cytec Industries), p-toluenesullonic acid monohydrate (0.13 g), and a dye-attached, hydroxyl-functional polyester resin (3.36 g) were dissolved in a mixture of 84.94 g of 1-methoxy-2-propanol and 9.43 g ethyl lactate by stirring to form a thermosetting anti-reflective coating composition. The solution was passed through a 0.2 µm fluorinated filter to remove microparticulates before spin coating.

The solution was spin coated onto silicon and quartz wafers at 2500 rpm for 60 seconds and then baked on a hot plate at 175° C. for 60 seconds to form a cured anti-reflective coating layer which was uniform and defect-Free. The film thickness of the coating as determined by ellipsometry was 1573 Å. The optical density of the film was 8.6 per micron at 193 nm, 3.0 per micron at 248 nm, and 4.8 per micron at 365 nm.

Spin coating of liquid ethyl lactate, a common photoresist solvent, over the cured anti-reflective coating layer produced a negligible film thickness change (<10 Å) in the anti-reflective layer, indicating it was highly crosslinked and solvent-resistant.

A positive photoresist was applied over the anti-reflective coating layer and then baked, blanket-exposed, and developed away to see if an intermixed layer of photoresist and anti-reflective coating remained on the latter surface. (If an intermixed layer is present, the thickness of the anti-reflective coating layer will appear to increase after photoresist processing since a portion of the photoresist remains linked to the surface of the anti-reflective coating.) In this instance, the apparent increase was <10 Å, indicating that effectively no intermixing occurred.

Example 3

An anti-reflective coating composition for 436 nm exposing wavelength applications was prepared by combining a cellulose ester binder, a reactive phenolic-functional dye (curcumin), an epoxy resin, an aminoplast crosslinking agent, and an acid catalyst in solution.

a. Formulation of Anti-Reflective Coating Composition

The following ingredients were combined by stirring to form a 3.6 wt. % solids content anti-reflective coating composition corresponding to the present invention:

| Component | Weight (g) |
| --- | --- |
| cellulose acetate hydrogen phthalate (as 5 wt. % solution in propylene glycol monomethyl ether or PGME) | 28.40 |
| curcumin (dye) | 1.02 |
| epoxy resin (as 50 wt. % solution of Ciba Geigy's Araldite MY720) | 0.74 |
| CYMEL 1141 (Cytec Industries) aminoplast crosslinking agent | 0.72 |
| p-toluenesulfonic acid monohydrate | 0.07 |
| PGME (solvent) | 69.05 |

Example 3 (continued)

b. application and Testing of Anti-Reflective Coating

The anti-reflective coating composition was applied onto two silicon wafers by spin coating at 2000 rpm for 60 seconds and then baked for 60 seconds at 168° C. under vacuum on a hot plate to insolubilize the coating. One coated wafer was immersed in photoresist developer and the other puddled with ethyl lactate, a common photoresist solvent, to test resistance to these media.

The average starting thickness (based on 5 ellipsometry measurements per wafer) of the anti-reflective coating for Specimen 1 was 923 Å; that for Specimen 2 was 915 Å. After immersion in 0.26 N tetramethylammonium hydroxide developer, the average thickness for Specimen 1 increased to 933 Å (+1.1%). The small thickness change indicated that the coating was highly crosslinked, minimizing loss of polymer and dye. Specimen 2 was puddled with ethyl lactate for 5 seconds and the solvent then spun off to determine resistance to the solvent. For this stripped specimen, average film thickness was now 913 Å (−0.24%). Again the small change was insignificant and indicated that the cured coating had excellent solvent resistance.

Absorbance and ethyl lactate stripping tests were made with the coating applied onto a quartz wafer. The optical absorbance (A) of the coating at 436 nm was 0.4558 as determined by a UV-visible spectrophotometer. (This corresponds to an optical density [OD] of 5.0/micron, which is more than sufficient for 436 nm exposing wavelength applications.) After ethyl lactate stripping, the optical absorbance was 0.4496 (−1.4%), indicating there was virtually no dye removed by the solvent washing process.

What is claimed is:

1. An improved anti-reflective coating composition comprising:

a solvent-soluble cellulosic binder selected from the group consisting of cellulose esters and cellulose ethers;

an alkylated aminoplast crosslinking agent derived from melamine, urea, benzoguanimine, or glycoluril;

an acid catalyst or a latent acid catalyst which upon heating generates a catalytically active acid species;

a solvent vehicle with high solvency for aminoplasts and cellulosic binders and effective surface wetting and evaporation properties to obtain a defect-free coating quality and feature coverage at coating thicknesses of 0.05 to 0.20 microns for microlithographic processing; and a solvent-soluble dye or dye mixture comprising effective functional groups for reaction with the aminoplast crosslinking agent during a thermal curing cycle for the composition.

2. The composition of claim 1, wherein said solvent-soluble dye is a phenolic-functional compound or a mixture of phenolic-functional compounds.

3. The composition of claim 1, wherein said cellulosic binder is a cellulose ester and the solvent is selected from the group consisting of ethyl lactate, 1-methoxy-2-propanol, cyclohexanone, 2-heptanone, ethyl 3-ethoxypropionate, propylene glycol methyl ether acetate, methyl 3-methoxypropionate, or their admixtures.

4. The composition of claim 1, said cellulosic binder being a cellulose ether comprising sufficient residual hydroxyl groups to allow insolubilization by reaction with said aminoplast crosslinking agent, and wherein said aminoplast crosslinking agent is present in said composition in sufficient quantities to provide from 0.2 to 2 reactive equivalents of alkoxymethyl crosslinking function per reactive group on the polymer binder and dye.

5. The composition of claim 1, said composition further comprising a solvent-soluble dye or dye mixture comprising effective functional groups for reaction with the aminoplast crosslinking agent during a thermal curing cycle for the composition, said cellulosic binder being a cellulose ether comprising sufficient residual hydroxyl groups to allow insolubilization by reaction with said aminoplast crosslinking agent, and said aminoplast crosslinking agent being present in said composition in sufficient quantities to provide from 0.2 to 2 reactive equivalents of alkoxymethyl crosslinking function per reactive group on the polymer binder and dye.

6. An improved anti-reflective coating composition comprising:

a solvent-soluble cellulosic binder esterified with an ultraviolet light-absorbing aromatic monocarboxylic acid so as to leave sufficient hydroxyl groups on the cellulosic binder for crosslinking with the aminoplast during subsequent bake cycles;

an alkylated aminoplast crosslinking agent derived from melamine, urea, benzoguanimine, or glycoluril;

an acid catalyst or a latent acid catalyst which upon heating generates a catalytically active acid species; and a solvent vehicle with high solvency for aminoplasts and cellulosic binders and effective surface wetting and evaporation properties to obtain a defect-free coating quality and feature coverage at coating thicknesses of 0.05 to 0.20 microns for microlithographic processing.

7. The composition of claim 6, wherein the light-absorbing aromatic monocarboxylic acid is selected from the group consisting of 9-anthracenecarboxylic acid or a substituted cinnamic acid.

8. An improved anti-reflective coating composition comprising:

a solvent-soluble cellulosic binder chemically modified with a reactant selected from the group consisting of aromatic or arylaliphatic reactants to yield a dye-attached binder having increased light absorbency at ultraviolet wavelengths;

an alkylated aminoplast crosslinking agent derived from melamine, urea, benzoguanimine, or glycoluril;

an acid catalyst or a latent acid catalyst which upon heating generates a catalytically active acid species; and a solvent vehicle with high solvency for aminoplasts and cellulosic binders and effective surface wetting and evaporation properties to obtain a defect-free coating quality and feature coverage at coating thicknesses of 0.05 to 0.20 microns for microlithographic processing.

9. An improved anti-reflective coating composition comprising:

a solvent-soluble cellulosic binder selected from the group consisting of cellulose acetate hydrogen phthalate and cellulose acetate trimellitate;

an alkylated aminoplast crosslinking agent derived from melamine, urea, benzoguanimine, or glycoluril;

an acid catalyst or a latent acid catalyst which upon heating generates a catalytically active acid species; and a solvent vehicle with high solvency for aminoplasts and cellulosic binders and effective surface wetting and evaporation properties to obtain a defect-free coating quality and feature coverage at coating thicknesses of 0.05 to 0.20 microns for microlithographic processing.

\* \* \* \* \*

UNITED STATES PATENT AND TRADEMARK OFFICE
CERTIFICATE OF CORRECTION

PATENT NO.    : 6,316,160 B1
DATED         : November 13, 2001
INVENTOR(S)   : Shao, Xie et al.

It is certified that error appears in the above-identified patent and that said Letters Patent is hereby corrected as shown below:

Column 1,
Line 9, please insert the following language:
-- FEDERALLY SPONSORED RESEARCH/DEVELOPMENT PROGRAM
    This inventon was made with Government support under contract DASG60-00-C-0044 awarded by the United States Army Space and Missile Defense Command. The Government has certain rights in the invention. --

Signed and Sealed this

Fifteenth Day of July, 2003

JAMES E. ROGAN
*Director of the United States Patent and Trademark Office*